United States Patent [19]

Larsen et al.

[11] Patent Number: 5,921,818
[45] Date of Patent: Jul. 13, 1999

[54] LOW CROSSTALK ELECTRICAL CONNECTOR

[75] Inventors: Wayne David Larsen; Julian Robert Pharney, both of Indianapolis, Ind.

[73] Assignee: Lucent Technologies Inc., Murray Hill, N.J.

[21] Appl. No.: 08/881,030

[22] Filed: Jun. 23, 1997

[51] Int. Cl.[6] ................................................... H01R 23/02
[52] U.S. Cl. ........................ 439/676; 439/344; 439/941
[58] Field of Search .................................... 439/676, 941, 439/344

[56] References Cited

U.S. PATENT DOCUMENTS

| | | | |
|---|---|---|---|
| 4,188,505 | 2/1980 | O'Connor | 179/1 PC |
| 4,261,633 | 4/1981 | Abernethy | 339/97 P |
| 4,865,564 | 9/1989 | Denkmann et al. | 439/404 |
| 5,096,442 | 3/1992 | Arnett et al. | 439/676 |
| 5,186,647 | 2/1993 | Denkmann et al. | 439/395 |
| 5,362,257 | 11/1994 | Neal et al. | 439/676 |
| 5,501,617 | 3/1996 | Arnett | 439/676 |
| 5,586,914 | 12/1996 | Foster, Jr. et al. | 439/676 |

*Primary Examiner*—Hien Vu
*Assistant Examiner*—Yong Ki Kim

[57] ABSTRACT

A high frequency electrical connector includes a number of input terminals and output terminals that are interconnected by three metallic lead frames mounted on a dielectric spring block. The lead frames comprise flat elongated conductors, each terminating in a spring contact at one end and an insulation displacement connector at the other end. The lead frames are mounted on top of each other and their conductors are generally parallel and close to each other. Selected conductors of the lead frames crossover each other when they are mounted on the spring block but are prevented from making contact with each other at the crossover point. One pair of adjacent conductors are spaced a first distance from each other up to the crossover point, and a second, greater distance from each other beyond the crossover point for a portion of their lengths. The conductors of the one pair cross each other at a second crossover point. The conductors of a second conductor pair are crossed over one of the conductors of a third conductor pair and are closely spaced at the crossover point.

3 Claims, 7 Drawing Sheets

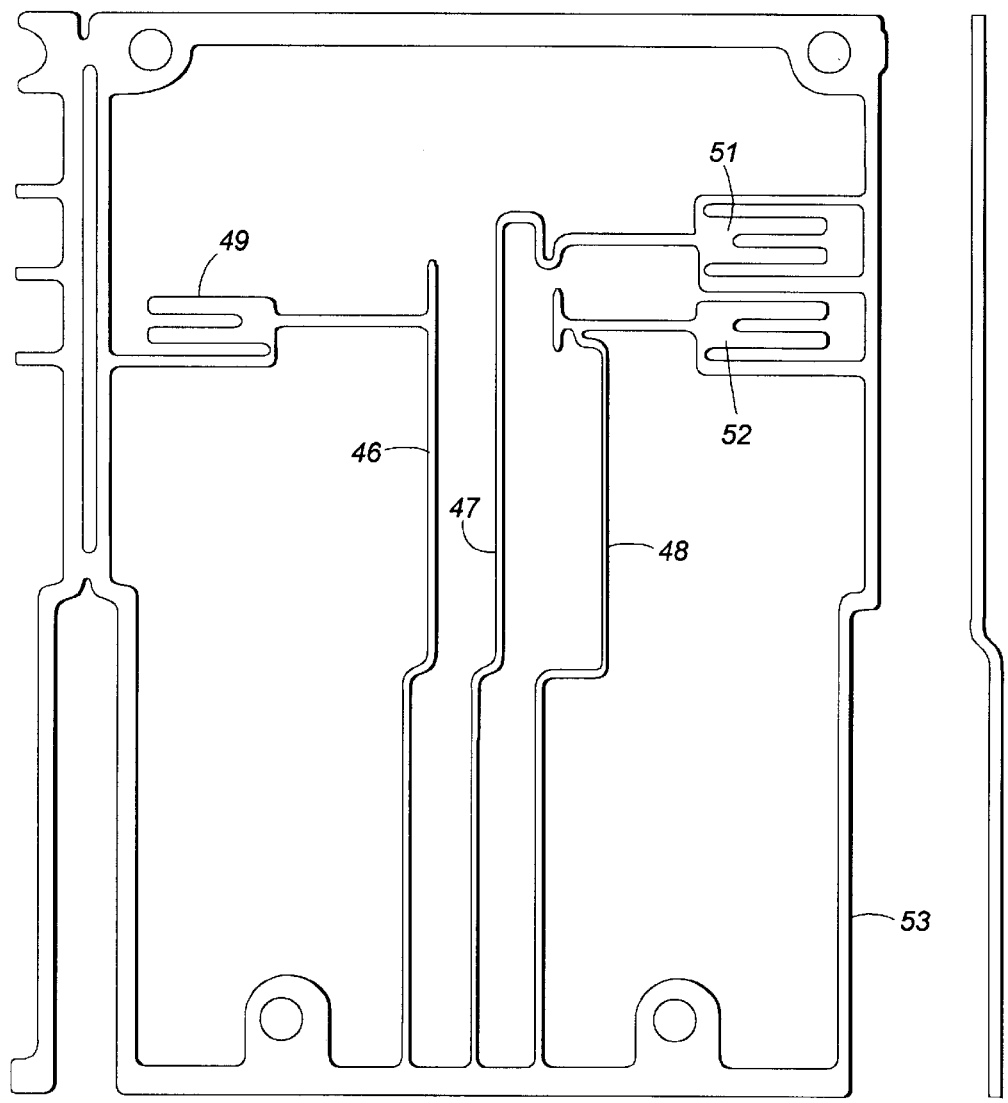
FIG. 5A
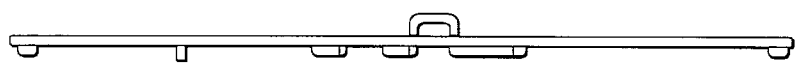
FIG. 5B
FIG. 5C

LOW CROSSTALK ELECTRICAL CONNECTOR

FIELD OF THE INVENTION

The present invention relates to an electrical connector. In particular, the invention relates to a modular connector of the type used in telecommunications equipment.

BACKGROUND OF THE INVENTION

Modern communication needs have grown to the point that multiple communication outlets frequently need to be located in close proximity, at the same customer premises, in order to serve multiple devices including modems, telephones, and facsimile machines. It is undesirable to clutter a wall with many individual outlets, each serving a separate device. furthermore, when multiple outlets are brought together within the same apparatus, it is generally quite difficult to make the needed wiring connections in a convenient manner.

In order to solve these problems, various devices have heretofore been developed including the AT&T 42-type connecting block described in U.S. Pat. No. 4,188,505. That patent discloses an electrical connector having an input jack for receiving a modular plug, and screw-down terminal for receiving wires whose ends have been stripped of insulation. The input jack is also electrically connected to the screw-down terminals through snap-on connectors. While 42-type connecting blocks perform their intended function in an acceptable manner, a more compact connector is desired.

U.S. Pat. No. 4,261,633 describes a "Wiring Module for Telephone Jack" for use in connection with a wall plate. The wiring module described therein includes a metallic lead frame having a plurality of conductors that function as spring contacts, at one end of the lead frame, after insertion into an associated jack frame. Free-standing electrical connecting terminals are connected to the conductors at the end of the lead frame. The conductors of the lead frame fan out as they extend toward the connecting terminals. Nevertheless, these terminals are so close together that considerable dexterity is required for making connections by hand. Furthermore, although this wiring module achieves a certain degree of compactness, it appears that the associated wall plate can accept the maximum of only two such modular jacks before a second wall plate is required.

U.S. Pat. No. 4,865,564 discloses a "Wall Mounted Connecting Block" in which the conductors of a metallic lead frame are shaped as inclusion-displacing connectors, at one end of the lead frame, and they function as connecting terminals to facilitate making electrical connections by hand. The entire assembly is suited for wall mounting. Unfortunately, however, a single modular jack fills the entire available space of a conventional wall outlet.

U.S. Pat. No. 5,096,442 entitled "Compact Electrical Connector" issued to J. R. Arnett, et al. on March 17, 1992 describes a compact electrical connector which is formed from a metallic lead frame in a spring block. The lead frame comprises a number of flat elongated conductors, each terminating in a spring contact at one end and an insulation displacing connector at the other end. The insulation displacing connectors are folded around opposite side walls of the spring block to achieve compactness, and the spring contacts are folded around its front surface for insertion into a modular jack. The front surface of the spring block includes a tongue-like projection which fits into one end of a jack frame and interlocks therewith. A dielectric cover surrounds the spring block and lead frame assembly to assist in supporting the lead frame and electrically insulating it from external interference. Up to six such compact modular jacks can be mounted on a single wall plate having conventional dimensions. While the electrical connector described therein has met with commercial success, it has been found that for communications applications having high frequency signals and improved connector is required.

U.S. Pat. No. 5,186,647 entitled "High Frequency Electrical Connector" issued to W. J. Denkmann, et al. describes an electrical connector for conducting high frequency signals which includes a number of input and output terminals which are interconnected by a pair of metallic lead frames mounted on a dielectric spring block. The lead frames are identical to each other and comprise several flat elongated conductors. Each conductor terminates in a spring contact at one end and an insulation-displacing connector at the other end. The lead frames are mounted on top of each other and their conductors are generally parallel and close to each other. Only three of the conductors of each lead frame are arranged to overlap three of the conductors of the other lead frame, and this occurs in a designated crossover region without electrical contact being made because of a reentrant bend in the conductors in the crossover region. As a result, the connector described therein has considerably less crosstalk between specific conductors than devices heretofore know.

Nevertheless, for a number of applications, an electrical connector having even less crosstalk would be desirable. In particular, the rate of data flow, which has increased substantially in recent years, has led to networks that have evolved to accommodate not only a greater number of users but also higher data rates. At higher data rates the wiring paths become antennae which both broadcast and receive electromagnetic radiation. Signal coupling ("crosstalk") between different pairs of wires is a source of interference that degrades the ability to process incoming signals. This is manifested quantitatively as decreased signal-to-noise ratio, and, ultimately, as an increased error rate. Accordingly, crosstalk becomes an increasingly significant concern in electrical design as the frequency of interfering signals increases.

SUMMARY OF THE INVENTION

In accordance with the present invention, an electrical connector for connecting an ordered array of input terminals to an ordered array of output terminals is disclosed. More particularly, a high frequency electrical connector is shown and described in U.S. Pat. No. 5,186,647 of Denkman et al., the disclosure of which is incorporated herein by reference, and is modified in accordance with the principles of the invention to produce improved crosstalk performance at the higher frequencies.

The connector of the invention, in an illustrative embodiment thereof, comprises eight conductors spaced from each other in generally parallel relationship. The input terminals of the electrical connector comprise insulation displacement connectors, each having a pair of opposing contact fingers which function to make electrical and mechanical connection to an insulated wire inserted therein. Further, the output terminals of the electrical connector comprise wire springs. In accordance with the principles of the invention, three lead frames, each comprising an array of conductors, are mounted on a dielectric block, with each conductor terminating at one end in a wire spring and, at the other end, in an insulation displacing connector. Selected conductors of the lead frames crossover each other when they are mounted on the dielectric block, with each conductor terminating at one end in a wire spring and, at the other end, in an insulation displacing connector. Selected conductors of the lead frames cross over each other when they are mounted on the dielectric spring block, but are prevented from making electrical contact with each other at the point or points of crossover. One of the conductors may, at the point of crossover, include an upward re-entrant bend and the other conductor a downward re-entrant bend.

In more particularity, conductors 7 and 8 which are on different lead frames and which together form pair 4 of the connector, have a first crossover region leading to wide spacing between them, thereby forming an enlarged inductive loop which, in turn, produces a more optimum crosstalk cancellation with lead 6 of pair 3. A second crossover between leads 7 and 8 beyond the inductive loop enhances the crosstalk cancellation between pairs 4 and 1 (leads 4 and 5). In addition, conductors 4 and 5, which form pair 1, are situated between conductors 3 and 6, which form pair 3, and inductive loops formed at the termination ends of these pairs are geometrically formed to provide a close match between primary and compensating crosstalk, thereby optimizing crosstalk compensation.

As a consequence of the foregoing, unique routing of the conductors, crosstalk compensation at the higher frequencies of use is optimized.

The various principles and features of the present invention will be more readily understood from the following detailed description, read in conjunction with the drawings.

BRIEF DESCRIPTION OF THE DRAWINGS

FIG. 5A is a plan view of a second lead frame used in the present invention and its associated carrier;

FIG. 5B is an end view of the lead frame carrier of FIG. 5A;

FIG. 5C is a side view of the lead frame and a carrier of FIG. 5A;

DETAILED DESCRIPTION OF EXEMPLARY EMBODIMENT

Figure 1:
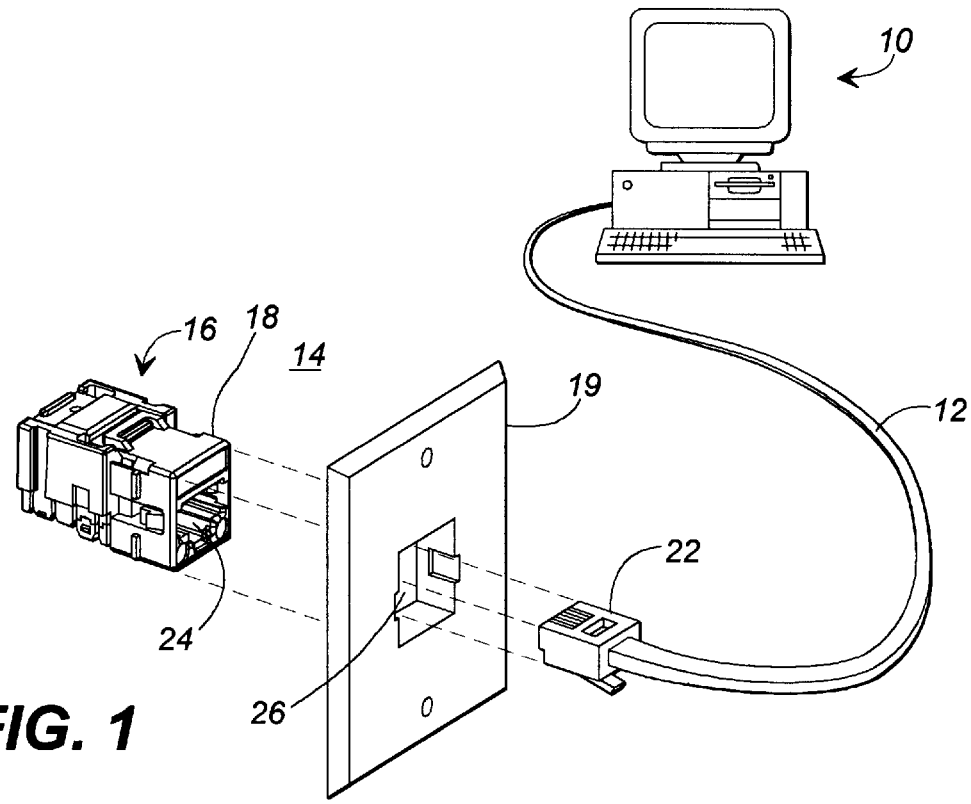
FIG. 1 illustrates the use of a modular connector to interconnect high speed station hardware with a communications table.

Referring now to FIG. 1, an interconnection between high speed station hardware, such as computer 10 and a cable 12 which comprises a number of wire pairs is accomplished by the use of standard telecommunications connectors that are frequently referred to as modular plugs and jacks. Specifications for such plugs and jacks can be found in Subpart F of the FCC, Part 68.500 Registration Rules. A jack assembly 14 is adapted to accommodate the use of modular plugs and jacks and comprises a connector 16, jack frame 18, and wall plate 19, which interlock together to provide a convenient receptacle for receiving a modular plug 22. Inserted into the opening 24 on the front side of a jack frame is modular plug 22 which communicates electrical signals via a cable to and from the station hardware. Inserted into the back side of the jack frame is an electrical connector which is constructed in accordance with the present invention. Wires from the cable are pressed into slots located on the opposite side walls of the connector to make mechanical and electrical connection thereto as will be discussed hereinafter. Four identical slots (not shown) are symmetrically positioned on the opposite side of the connector. The wall plate 19 includes an opening that receives and interlocks with the jack frame.

Figure 2:
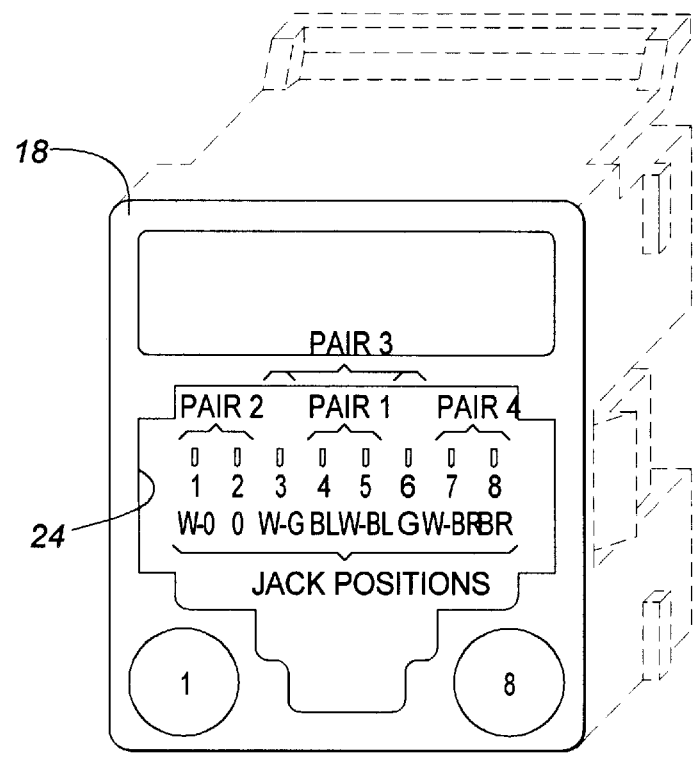
FIG. 2 illustrates a jack contact wiring assignment for an eight-position telecommunication outlet as viewed from the front opening.

Terminal wiring assignments for modular plugs and jacks are specified in ANSI/EIA/TIA-568-1991 which is the Commercial Building Telecommunications Wiring Standard. The Commercial Building Telecommunications Wiring Standard associates individual wire-pairs with specific terminals for an eight-position telecommunications outlet (T568B) in the manner illustrated in FIG. 2. The standard even prescribes the color of each wire and Near End Crosstalk performance in the frequency range of from 1–16 MHz. While the color assignment does not lead to difficulties the pair assignment does, particularly when high frequency signals are present on the wire pairs. One problem, for example, comes about from the fact that wire-pair 3 straddles wire-pair-1 as illustrated in FIG. 2, looking into the opening of the jack frame. If the jack frame and connector (see FIG. 1) include electrical paths that are parallel to each other and are in the same approximate plane, there is likely to be electrical crosstalk between wire pairs 1 and 3. In fact, many electrical connectors that receive modular plugs are configured that way and although the amount of crosstalk between wire-pairs 1 and 3 is insignificant in the audio frequency band, it is unacceptably high in frequencies above 1 MHz. Nevertheless, it is desirable to use modular plugs and jacks of this type at these higher frequencies because of connection convenience and costs.

Figure 3:
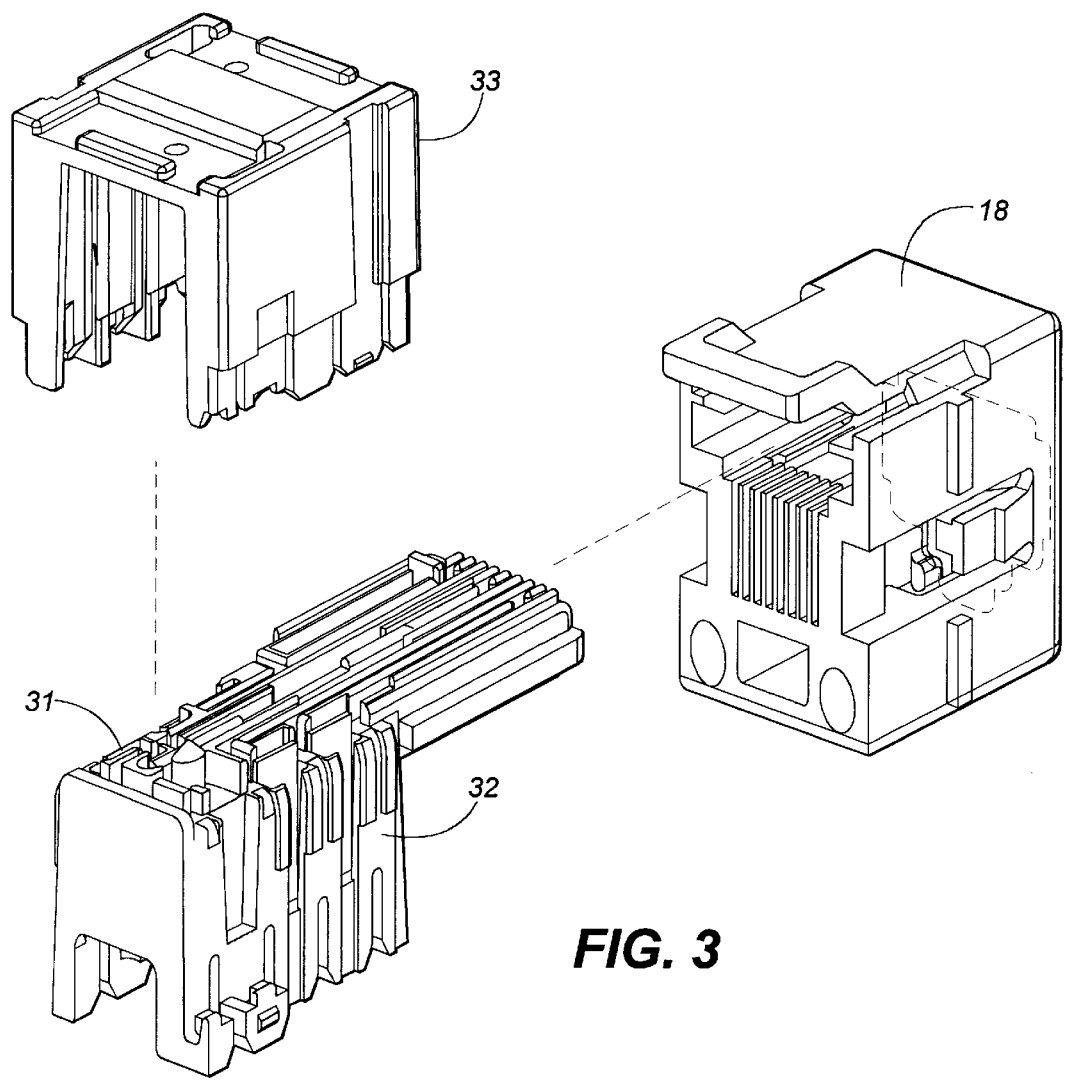
FIG. 3 is an exploded perspective view of a high frequency electrical connector in accordance with the present invention.
Figure 4:
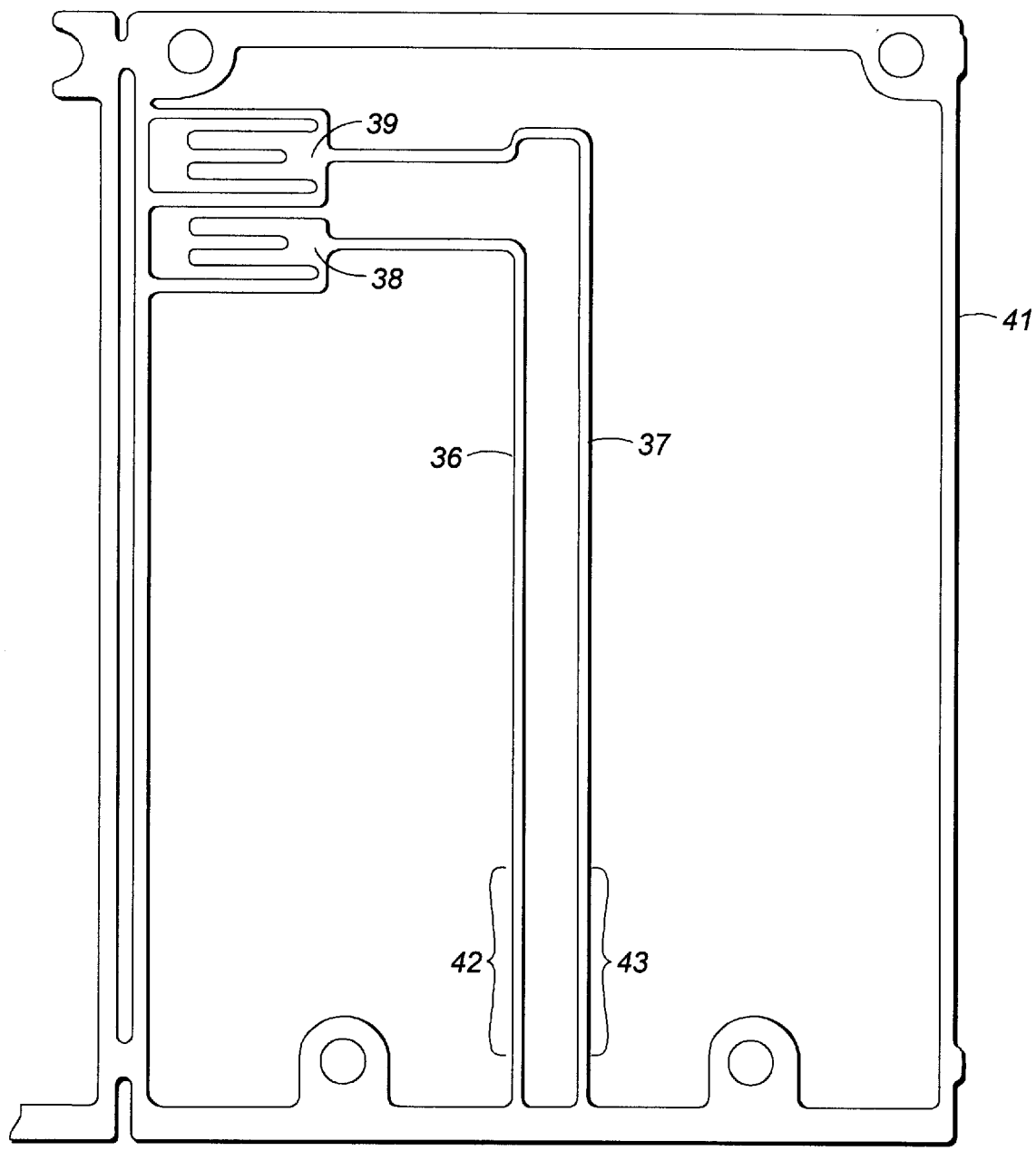
FIG. 4 is a plan view of a first lead frame used in the present invention and its associated carrier.

Referring now to FIG. 3, an exploded perspective view of the high frequency electrical connector and jack frame of the present invention is shown. As illustrated, the electrical connector 16 comprises a spring block 31, metallic lead frames 32, and cover 33, all joined together as indicated. With additional reference to FIG. 4, a first lead frame in accordance with the invention comprises two flat elongated conductive elements 36 and 37 that terminate at one end in insulation displacing connectors 38 and 39, respectively. Peripheral support structure 41 holds the conductive elements in a fixed relationship with respect to each other so that the lead frame can be easily handled. However, it is removed during assembly, so the lead frame is shaped to a desired electrical interconnection pattern which is preferably stamped 0.015 inch thick metal stock and gold plated in the end regions 42 and 43. During assembly, these end regions are bent around the spring block (see FIG. 3) to form the spring contacts within the modular jack. In view of the fact that a portion of the lead frame is used as a spring contact, the entire lead frame is made of resilient metal such as beryllium-copper, although a variety of other metal alloys can be used with similar results. Conductive elements are formed parallel to each other, and they reside in the same plane.

In addition, and in accordance with the principles of the invention, a second lead frame, depicted in FIGS. 5A and 5B, comprises three flat, elongated conductive elements 46, 47, and 48, terminating in insulation displacement connectors 49, 51, and 52, respectively. A peripheral support structure 53 holds the conductive elements in place until assembly, at which time it is removed from the conductive elements.

Figure 6A:
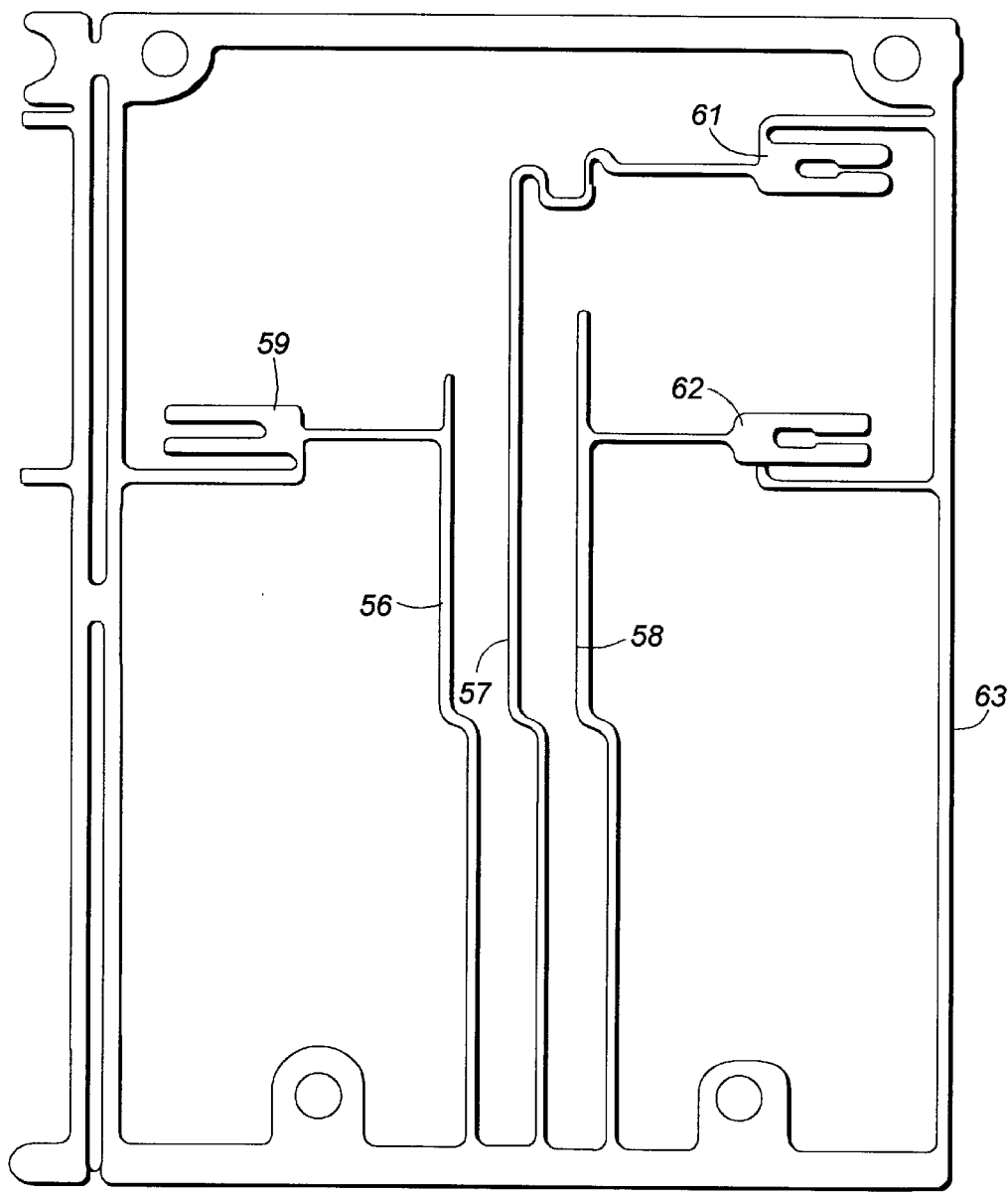
FIG. 6A is a plan view of a third lead frame used in the present invention and its associated carrier.
Figure 6B:
FIG. 6B is an end view of the lead frame and carrier of FIG. 6A.

A third lead frame, shown in FIGS. 6A and 6B, comprises three flat elongated conductive elements 56, 57, and 58, terminating in insulation displacement connectors 59, 61, and 62, respectively, and held in fixed position by a peripheral support structure 63.

In order to reduce crosstalk between conductive elements a technique was described in U.S. Pat. No. 5,186,647, referred to above, in which certain of the conductive elements are made to crossover each other in a predetermined region as can be seen in FIGS. 3 and 10 of that patent, where two identical lead frames are installed on top of each other that are reversed from left to right. Although a number of techniques can be used to electrically isolate the lead frames from each other, particularly in the region of the crossover, the preferred embodiment achieves electrical isolation by introducing a reentrant bend in the conductive elements of the lead frame. This is most clearly seen in the side view of the lead frame illustrated in FIG. 3 of the patent. Accordingly, when, as in the patent, a pair of lead frames are laid on top of each other, the conductive elements bulge away from each other in the crossover region. Another way to achieve electrical isolation is to insert a dielectric spacer made of insulating material such as Mylar between the lead frames.

Figure 9:
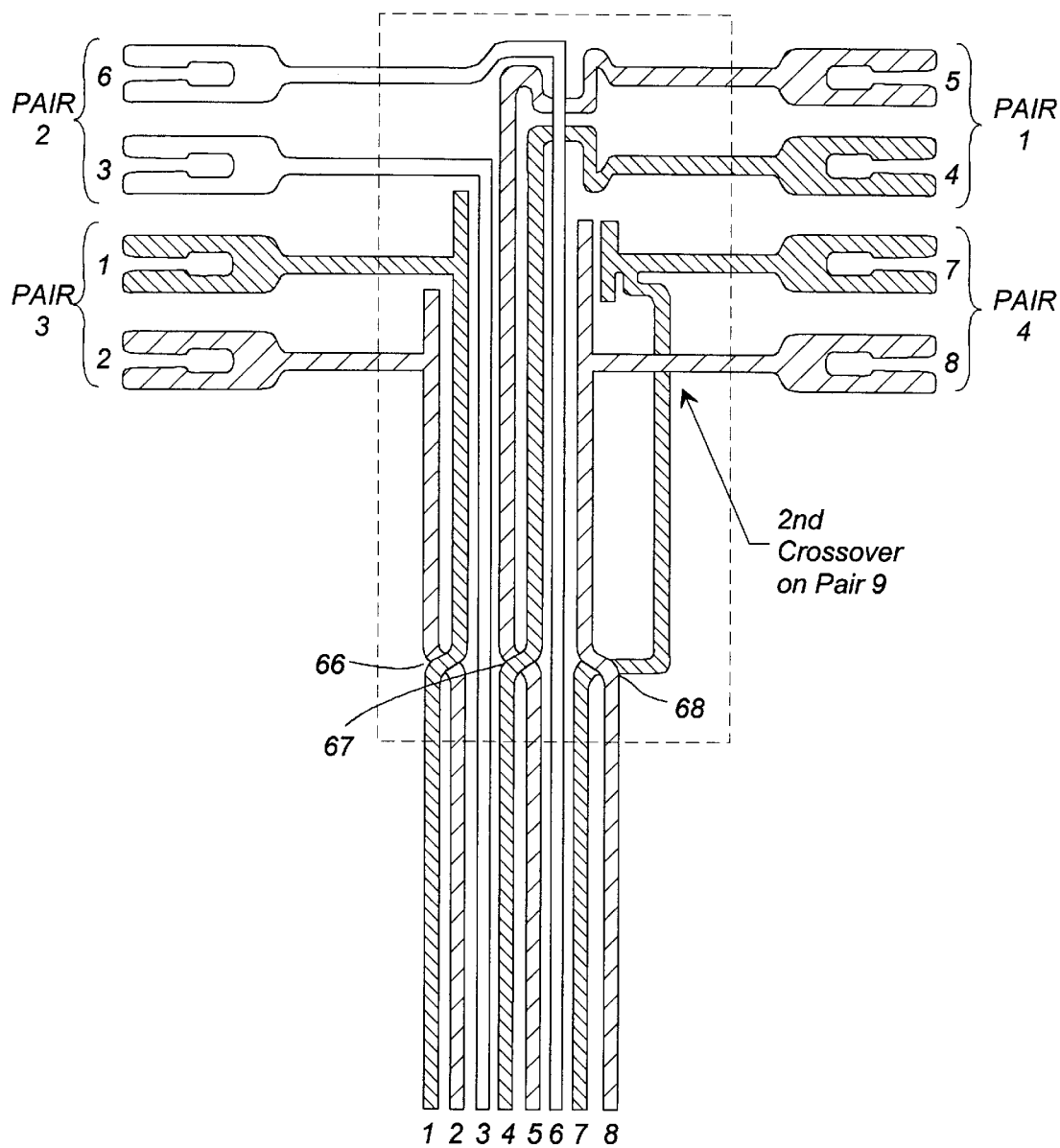
FIG. 9 is a plan view of the lead frames shown in FIGS. 4, 5A, 5B, 5C, 6A, and 6B, after assembly, illustrating the crossovers and inductive loops formed in certain conductors.

FIG. 9 depicts the conductive elements of the three lead frames in their assembled arrangement. It can be seen that conductive element 36 of FIG. 4 corresponds to lead 3 and element 37 corresponds to lead 6. Leads 3 and 6 form conductive pair 3, as shown in FIG. 2. Similarly, element 46, depicted in FIG. 5A, corresponds to lead 1, and elements 47 and 48 correspond to leads 4 and 7 respectively. Element 56 of FIG. 6A corresponds to lead 2 and element 57 and 58 correspond to leads 5 and 8. It can be seen in FIG. 9 that leads 1 and 2, 4 and 5, and 7 and 8 crossover (or under) each other in crossover regions 66, 67, and 68, which are adjacent the spring end of the spring block 31, shown in dashed lines.

Figure 7:
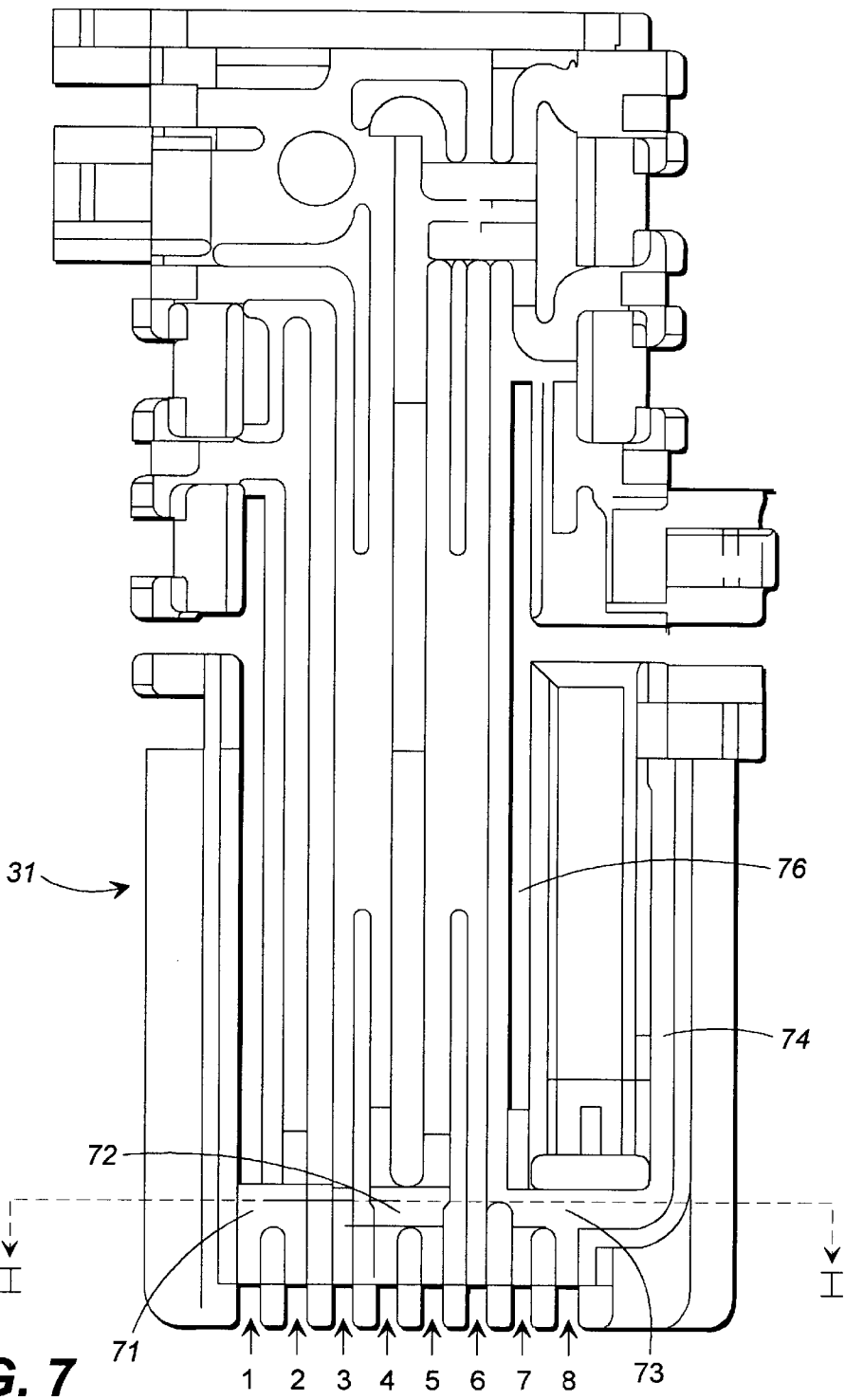
FIG. 7 is a top plan view of the spring block used in the present invention illustrating the routing of the lead frames.
Figure 8:
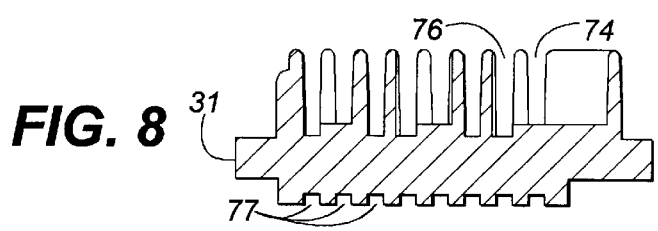
FIG. 8 is a cross-section view along the lines I—I of FIG. 7.

In FIG. 7 there is shown the top of the spring block 31, which shows the channels formed therein for the conductive leads 1 through 8. A crossover region 71 is formed in the block to accommodate the crossover 66 between leads 1 and 2. In like manner the crossover region 72 accommodates the crossover 67 between leads 4 and 5 and a crossover region 73 accommodates the crossover 68 between leads 7 and 8. The crossovers themselves are formed in the same or similar manner to those shown in U.S. Pat. No. 5,186,647, but differ therefrom in that they occur closer to the spring end of block 31 for better crosstalk compensation. It can be seen in FIG. 7 that the channel 74 for lead 7 is spaced a greater distance from the channel 76 than is the case for the other channels for leads 1 through 6. This spacing produces an inductive loop between leads 7 and 8 beyond the crossover region 73, as will be discussed hereinafter. FIG. 8 is a cross-sectional view of block 31 taken along the line I—I, and shows a plurality of channels 77 into which the leads 1 through 8 are fitted after being bent around the end of the block 31, as depicted, for example, in FIG. 3 of U.S. Pat. No. 5,186,647.

The lead frames are positioned on the top surface of the spring block 31 which includes the grooves or channels having the same pattern as the lead frame itself, as shown in FIG. 7. Heat is then selectively applied to the grooves, such as by ultrasonic welding, in order to deform the thermoplastic material from which the spring block is made to thereby permanently joint he lead frames and spring block together. Insulation displacing connectors are folded down the sides of the spring block while the conductors of the lead frames are wrapped around the tong-like protrusion of the spring block as shown in FIG. 3 of U.S. Pat. No. 5,186,647. Thereafter, a cover is joined to the spring block to create a single unitary structure. In accordance with the present embodiment of the invention, the spring block, cover, and jack frame are all made of a thermal plastic material such as polyvinyl chloride ("PVC").

After the insulation displacing connectors of the lead frames are folded around each side wall on the opposite sides of the spring block the spaces between the opposing contact fingers which form the insulation displacing connectors are aligned with wire receiving slots of the spring block so that a wire may pass therebetween. The side walls are substantially parallel to each other, and they are perpendicular to the top surface of the spring block. furthermore, when the cover is joined to the spring block, its slots are aligned with the spaces between opposing contact fingers of the insulation displacing connectors. As a result the insulation displacing connectors are sandwiched between the spring block and cover, and they are protected from the possibility of an inadvertent electrical short between adjacent connectors. After the cover is joined to the spring block, pins in the spring block protrude through two of the holes in the cover. These pins are heated and deformed preferably using ultrasonic welding to permanently join the cover to the spring block. The cover includes four symmetrically positioned holes so that it can be interlocked with the spring block in either of two positions. The electrical connector may now be inserted into the jack frame which includes a latch that cooperates with the shoulder molded into the top of the cover to interlock the two together. As illustrated, the jack frame shows numbers 1 and 8 on its front face to establish a number and convention for the positioning of terminals within a jack frame in accordance with option D of the ANSI/EIA/TIA-568 standard. Firing labels also include numbers 1–8 to identify which slot is interconnected to each specific terminal. Such labeling is particularly useful in the present invention where crossover is made by the conductors of lead frames changed the relative ordering of wires from the ordering that would result if the conductors were confined to the same plane. In particular, the pattern of grooves in the top surface are shown in detail to demonstrate the manner in which crossover between conductive paths is accomplished. Grooves are molded into the top surface. The grooves are approximately 0.03 inches deep and 0.02 inches wide in order to accommodate a lead frame which include conductors whose cross-section is generally square (0.15× 0.15 inches). Dielectric walls separate the grooves in order to provide electrical isolation for the conductors of a lead frame. However, certain of the dielectric walls, for example, the wall between grooves 1 and 2 are discontinuous in the region where crossover occurs. Furthermore, the grooves are preferably 0.05 inches deeper in this region. This is illustrated in the cross-sectional view of the spring block shown in FIG. 8. The purpose of the deeper grooves is to accommodate the reentrant bend in the lead frame where crossover occurs. The crossovers of the conductors of the lead frame substantially reduce crosstalk between otherwise parallel electrical paths. Accordingly, they provide the ability to use the telecommunication jacks of the present invention at significantly higher frequencies with significantly less crosstalk than would otherwise be possible.

The final conductor arrangement for the assembled connector, as depicted in FIG. 9, produces a substantive decrease in the inductance loop formed between leads 4 and 5 (pair 1) at the connector end through the routing of those leads in close proximity to each other as they crossover lead 6 of pair 3. Leads 7 and 8 (pair 4) are spaced a distance apart beyond crossover region 68 to produce an inductive loop which, in turn, produces more nearly optimum crosstalk compensation between pair 4 and pair 3 (leads 6 and 3). Leads 7 and 8 have a second crossover, as shown, which produces a reversal in the crosstalk compensation to produce a more nearly optimum crosstalk compensation between pairs 1 (leads 4 and 5) and pair 4.

While the principles of the invention have been disclosed as they relate to a connector having eight leads, they are applicable to other types of connectors having, for example, more leads or fewer leads. The foregoing description and the accompanying drawings have been and are for purposes of illustrating, in a preferred embodiment, the principles and features of the present invention. It should be noted that it will be obvious to those skilled in the art that many variations and modifications may be made to the embodiment herein depicted without substantial departure from the principles of the present invention. It is intended that all such variations and modifications be included herein as being within the scope of the present invention. Further, in the claims hereinafter set forth, the corresponding structures, materials, acts, and equivalents thereof and of all means or step-plus-function elements are intended to include any structure, materials, or acts for performing the functions with other elements as specifically claimed.

What is claimed is:

1. An electrical connector comprising:

a plurality of conductive elements having a plurality of conductive paths extending from a first end of said connector to a second end thereof;

said conductive elements terminating in a plurality of conductive members at said first end and in a plurality of spring contact members at said second end;

said conductive elements comprising a plurality of pairs of conductors interconnecting said conductive members and said spring contact members;

said conductors being spaced apart from each other at a first distance at said second end and mounted on a dielectric surface, said conductors being generally parallel to each other along a portion of said conductive paths, one of said conductors of at least a first pair crossing the other conductor of said first pair at a crossover point in the conductive path without making electrical contact therewith;

said one of said conductors and said other of said conductors being spaced apart a second distance greater than said first distance over a portion of said first pairs conductive path to define an inductive region between said first crossover point and said first end for said pair of conductors; and a second crossover point where said one conductor crosses said other conductor without making electrical contact therewith, said second crossover point being located between said inductive region and said first end.

2. An electrical connector as claimed in claim 1 wherein there are four pairs of conductors designated pair 1, pair 2, pair 3, and pair 4 comprising conductors designated, respectively, conductors 4 and 5, conductors 1 and 2, conductors 3 and 6, and conductors 7 and 8, and said one of said conductors is conductor 7 and said other of said conductors is conductor 8.

3. An electrical connector as claimed in claim 2 wherein conductors 4 and 5 cross each other at a third crossover point;

said conductors 4 and 5 each crossing conductor 6 within a crossover region wherein the spacing between conductors 4 and 5 is such as to decrease an inductive loop formed thereby.

\* \* \* \* \*